United States Patent [19]

Corrigan

[11] 4,045,186
[45] Aug. 30, 1977

[54] METHOD FOR PRODUCING LARGE SOFT HEXAGONAL BORON NITRIDE PARTICLES

[75] Inventor: Francis R. Corrigan, Westerville, Ohio

[73] Assignee: General Electric Company, Worthington, Ohio

[21] Appl. No.: 747,845

[22] Filed: Dec. 6, 1976

Related U.S. Application Data

[63] Continuation-in-part of Ser. No. 622,822, Oct. 15, 1975, abandoned, which is a continuation of Ser. No. 394,635, Sept. 6, 1973, abandoned.

[51] Int. Cl.² .................. B01D 9/02; B01J 17/04; C01B 35/00; C01B 21/06
[52] U.S. Cl. .................. 23/295 R; 156/624; 156/DIG. 86; 423/290
[58] Field of Search .......... 423/290; 23/293, 300, 23/295, 299; 156/624, DIG. 86

[56] References Cited

U.S. PATENT DOCUMENTS

| | | | |
|---|---|---|---|
| 2,839,366 | 6/1958 | Kamlet | 423/290 |
| 2,947,617 | 8/1960 | Wentorf | 423/290 |
| 3,144,305 | 8/1964 | O'Connor | 156/DIG. 86 |
| 3,189,412 | 6/1965 | Wood | 423/290 |
| 3,192,015 | 6/1965 | Wentorf | 156/DIG. 86 |
| 3,208,824 | 9/1965 | Litt | 423/290 |
| 3,212,852 | 10/1975 | Bundy | 156/DIG. 86 |
| 3,473,894 | 10/1969 | Bable | 423/290 |
| 3,701,826 | 10/1972 | Devries | 423/290 |
| 3,772,428 | 11/1973 | Devries | 423/290 |
| R27,608 | 4/1973 | Lubatti | 423/290 |

FOREIGN PATENT DOCUMENTS

| | | | |
|---|---|---|---|
| 44-1697 | 7/1969 | Japan | 423/290 |

OTHER PUBLICATIONS

Dulin et al., Soviet Physics–Solid State, vol II, No. 5, Nov. 1969, pp. 1016–1020.
Devries, Journal of Cryst Growth, 3-4, 1972, pp. 88–92.
Pease, Nature, vol. 165, May 6, 1950, pp. 722–723.
Milledge et al., Nature, No. 4687, Aug. 29, 1959, p. 715.
Foubeau et al., Ufer Ternare Metall-Bornitide, Z. Anorg. Chem., vol. 310, pp. 248–260, 1961.

*Primary Examiner*—Stephen J. Emery
*Attorney, Agent, or Firm*—Dennis A. Dearing; Donald J. Voss; F. H. Newhauser

[57] ABSTRACT

Soft hexagonal boron nitride crystals of 200–600 microns platelet size are produced from crystals of less than fifty microns particle size by mixing the small crystals with $Li_3N$, simultaneously heating and pressurizing said mixture to a temperature and pressure in a restricted region of the graphitic (hexagonal) boron nitride (GBN) stable region of the pressure-temperature (P-T) phase diagram of boron nitride, cooling and depressurizing said mixture, and separating off the water soluble material present in the mixture to leave a residue of large crystals of boron nitride.

7 Claims, 1 Drawing Figure

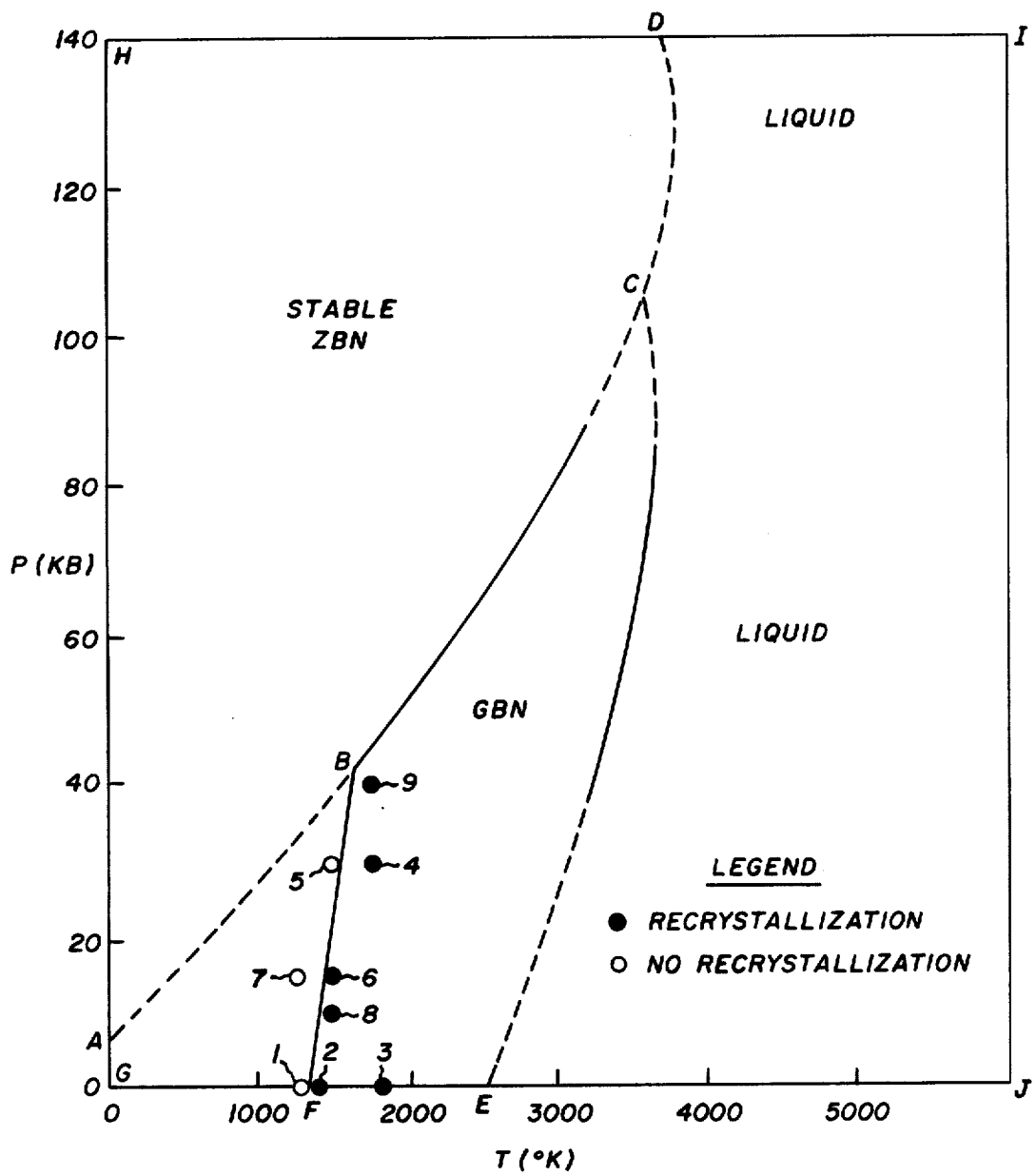

METHOD FOR PRODUCING LARGE SOFT HEXAGONAL BORON NITRIDE PARTICLES

CROSS REFERENCE TO RELATED APPLICATIONS

This is a continuation-in-part application of application Ser. No. 622,822, filed Oct. 15, 1975, which is a continuation of application Ser. No. 394,635, filed Sept. 6, 1973, both abandoned.

BACKGROUND OF THE INVENTION

Boron nitride has been made in the form of soft low-density crystals having a hexagonal crystalline configuration similar to graphite. It has also been formed into very hard high-density crystals with a cubic crystalline formation (hereinafter ZBN) having an atomic crystal structure similar to the mineral zincblende or a hexagonal crystalline configuration (hereinafter WBN), similar to the mineral wurtzite. High-density material having a zincblende structure was disclosed and claimed in Wentorf U.S. Pat. No. 2,947,617. High-density material having a wurtzite structure was disclosed and claimed in Bundy et al. U.S. Pat. No. 3,212,851. The present invention is converned with the preparation of soft low-density crystals having a larger particle size than was previously available. The soft low-density form of boron nitride similar to graphite will hereafter be referred to as "graphitic boron nitride" (GBN).

Most of the processes for preparing GBN utilize boric anhydride as the boron source material. This is reacted with various nitrogen-containing compounds such as $NH_3$, $CaCN_2$, or $NaCN$ usually in the presence of an inorganic filler at temperatures varying from 800° C to 1700° C. Examples of the preparation of GBN are British patent 742,326; U.S. Pat. Nos. 2,808,314, 2,855,316, 2,888,325, 2,839,366, 2,865,715, and 2,834,650; and Russian patent 129,627. The commercially available GBN produced according to any of these processes has particle sizes ranging up to a maximum of one to two microns. U.S. Pat. No. 3,144,305 discloses a process for recrystallization of GBN by heating boron nitride in an inorganic liquid to a temperature above 1000° C in contact with a preformed hexagonal boron nitride seed crystals. This patent reported recrystallized GBN particles having maximum dimensions up to forty microns, Pyrolytic boron nitride is a form of GBN produced from the gaseous reaction:

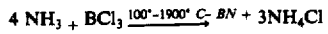

$$4\ NH_3 + BCl_3 \xrightarrow{100°-1900°\ C} BN + 3NH_4Cl$$

Pyrolytic boron nitride formed by this process is deposited in well oriented form but with poor crystallinity. U.S. Pat. No. 3,578,408 describes the recrystallization of pyrolytic boron nitide by compression annealing to produce a highly oriented well crystallized material. However, material produced by this process is rather costly in view of the cost of the raw materials used. In addition, the method requires operating temperatures in the 2250° C – 2,540° C range.

BRIEF DESCRIPTION OF THE DRAWING

The drawing is a pressure-temperature (P-T) phase diagram for boron nitride illustrating the values of pressure and temperature for practicing this invention.

SUMMARY OF THE INVENTION

The present invention provides a method for producing GBN particles larger than 50 microns in size and normally larger than 100-200 microns in size. This is accomplished by mixing soft HBN particles of less than 50 microns average particle size with $Li_3N$, the boron nitride comprising 50 to 85 mol percent of the mixture, heating and pressuring said mixture to a temperature and a pressure in a restricted region of the GBN stable region of the pressure-temperature (P-T) phase diagram of boron nitride cooling the mixture, and separating the boron nitride from the mixture by a process such as the aquaeous solution of water-soluble material and removal thereof as by filtration to leave a residue of hexagonal boron nitride crystals having an average particle of 100 microns or more.

DESCRIPTION OF THE PREFERRED EMBODIMENTS

The basic process of the invention is the reaction of small particle-sized boron nitride with $Li_3N$ and the subsequent recrystallization of larger-sized crystalline hexagonal boron nitride from the mixture at elevated temperatures which are above the melting point of the product.

In the Figure, a pressure-temperature (P-T) phase diagram of boron nitride is shown to illustrate as will be described hereinafter the operating region for recrystallizing small HBN particles into larger HBN particles in accordance with the features of this invention. ZBN is stable in Region ADH. GBN is liquid in Region EDIJ and is stable in Region ACE. The metastable regions for GBN, WBN and ZBN are not shown for clarity.

In accordance with the features of this invention, it has been discovered that HBN powder of a few microns in size can be recrystallized into HBN particles larger than 50 microns in size and normally larger than 100-200 microns in size. The line BF represents the minimum temperature as a function of pressure at which recrystallization occurs. The minimum temperature along line BF required for recrystallization exhibits a positive slope increasing from approximately 1370° K (1100° C) at atmospheric pressure to about 1770° K (1500° C) at 40 kilabors (KB). Thus, Region FBCE represents a restricted region of the GBN stable Region ACE in which recrystallization occurs.

A preferred embodiment of this invention which is carried out at atmospheric pressure will now be described. Lithium nitride and boron nitride powders comprising 50 to 85 mol percent boron nitride are intimately mixed and placed in containers composed of such materials as molybdenum and graphite for heating. Heating is carried out in a tubular induction furnace. Where the container is composed of carbon, the graphite serves as a high-frequency field susceptor. Where molybdenum is used as the container material, the molybdenum is either partially or wholly surrounded by a carbon susceptor to provide coupling with a high-frequency field. Inlet and outlet feedthroughs are provided for maintaining a nitrogen gas atmosphere and a thermocouple feedthrough is provided for monitoring temperature.

After placing the powder mixture in the furnace, the furnace is flushed for fifteen minutes with nitrogen gas before heating is started. The mixture is then heated at a rate of about 10°-20° C. per minute by adjusting the power of the radio frequency generator until a minimum temperature of about 1100° C is reached. The temperature is maintained for twenty minutes or more and the mixture is then allowed to cool in the flowing nitrogen atmosphere. The sample is then removed from the container and treated with boiling water to dissolve all soluble components. The residue is recrystallized boron nitride which is washed with boiling water and air dried.

A clue to the mechanism of the reaction was provided by using a quartz tube furnace to allow visual observation of the mixture during heat. At temperatures between 100° C and 200° C the color of the amorphous lithium nitride was observed to change from reddish brown to white. The cause of this color change has not been determined with certainty, but it is believed to be due to a phase change in the lithium nitride from the amorphous phase to a crystalline phase. On further heating an exothermic reaction was observed within the temperature range of 550° C to 650° C. The exothermic nature of the reaction was evident by an increase in the measured heating rate, the heat evolution being high enough to raise the temperature locally and momentarily to some melting temperature in the system. A melted zone was observed to progress momentarily through the sample. It is believed that the action which took place was:

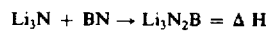

$Li_3N + BN \rightarrow Li_3N_2B = \Delta H$

After the momentary melting, the material resolidified but as the temperature increased to within the range 800°-900° C, melting was again observed. On continued heating above the melting point, white fumes were observed in the nitrogen gas passing from the furnace. These fumes are believed to result from the incongruent vaporization of lithium nitride from the melt. Incongruent vaporization of lithium nitride would suggest that the lithium nitride and boron nitride species exist separately in the melt or form only a weakly associated $Li_3N.BN$ complex.

Recrystallization was observed for high-temperature holding periods from 20 minutes to 4 hours and temperatures from 1100° C to 1550° C. Recrystallization has been obtained with starting mixtures having boron nitride compositions varying from 50 to 85 mol percent. Best results have been obtained with starting compositions corresponding to the $Li_3N.BN$ complex (43 weight percent boron nitride, 57 weight percent lithium nitride). Mixtures containing excess boron nitride show complete recrystallization of the boron nitride up to 80 weight percent boron nitride.

Two possibilities for explaining the recrystallization mechanism appear possible. First, vaporization of lithium nitride from the melt at high temperatures would result in excess boron nitride compared to that required for the postulated $Li_3N.BN$ complex resulting in precipitation of the excess boron nitride to form the recrystallized particles.

Alternatively, if, as postulated above, lithium nitride and boron nitride species are separated or only loosely associated within the melt, the liquid can more aptly be thought of as a solution of boron nitide in lithium nitride. A decreasing solubility of boron nitride with increasing temperature — sometimes referred to as "retrograde solubility" — which would be consistent with the exothermic nature of the lithium nitride plus boron nitride reaction, would result in precipitation and growth of boron nitride particles as the temperature is increased above the melting temperature. Recrystallization attained under high pressures supports this view since, under these conditions, vaporization is severely repressed.

The practice of the invention at atmospheric pressure is illustrated by the following examples which are carried out under the conditions set forth in the Table below:

EXAMPLES 1 - 3

Lithium nitride and boron nitride powders comprising 80 wt. percent boron nitride were intimately mixed and placed in carbon containers. The boron nitride powder had an average particle size of a few microns. After placing the powder mixture in a tubular indiction furnace, the furnace was flushed for fifteen minutes with nitrogen gas before heating is started. The mixture was then heated at a rate of about 10°-20° C per minute by adjusting the power of the radio frequency generator until the designated temperature was reached. This temperature was maintained at the designated time and the mixture was allowed to cool in the flowing nitrogen atmosphere. The sample was then removed from the container and treated with boiling water to dissolve all soluble components. After removal of the soluble components, the residue was washed with boiling water, air dried and evaluated to determine whether recrystallization had occurred. Recrystallizated particles having particle dimensions in the range of 100 to 200 microns was observed. Identification of the particles as GBN was verified by X-ray diffraction analysis.

The practice of the invention under high-pressure conditions is illustrated by the following examples which are carried under the conditions recorded in the Table below:

EXAMPLES 4 - 9

A powder mixture of soft boron nitride of an average particle size of a few microns and $Li_3N$ powder, comprising 80% by weight BN and 20% by weight $Li_3N$, was intimately mixed and placed in a conventional high pressure titanium reaction cell similar to the type shown in U.S. Pat. No. 2,947,617. After placing the reaction cell in a conventional high pressure, high temperature apparatus of the type described in U.S. Pat. No. 2,941,248, the mixture was pressurized and then he heated to designated values of temperature and pressure. The mixture was held at (simultaneously subjected to) the designated temperature and pressure for a designated period of time. The reaction cell was then cooled and depressurized. The sample was removed from the cell and treated with boiling water to dissolve all soluble components. The residue was then visually evaluated to determine whether recrystallization occurred. Recrystallized material having particle dimensions up to 200 microns was observed in the examples in which crystallization occurred. The particles were verified as being GBN by X-ray diffraction analysis.

TABLE

| Example | Pressure (kbar) | Temperature (° C) | Temperature (° K) | Time (min.) | Recrystallization Results |
|---------|-----------------|-------------------|-------------------|-------------|---------------------------|
| 1 | 0 | 950 | 1220 | 180 | No |
| 2 | 0 | 1100 | 1370 | 20 | Yes |
| 3 | 0 | 1550 | 1820 | 20 | Yes |
| 4 | 30 | 1500 | 1770 | 40 | Yes |
| 5 | 30 | 1250 | 1520 | 40 | No |
| 6 | 15 | 1250 | 1520 | 30 | Yes |
| 7 | 15 | 1000 | 1270 | 30 | No |
| 8 | 10 | 1250 | 1520 | 30 | Yes |
| 9 | 40 | 1500 | 1770 | 8 | Yes |

The values of the pressures and temperature conditions for Examples 1-9 are plotted in the Figure to form the line BF. The enumeration of each data point corresponds to the example number.

While no experiments have been run for values of pressure above 40 KB, it will be apparent to those skilled in the art that the minimum temperatures for recrystallization at pressurization levels above 40 KB is determined by Line BC of the phase diagram. "Simultaneously," as used herein, in regard to application of heat and pressure to the reaction cell, means that the designated values of temperature and pressure exist or occur at the same time but does not mean that the application of heat and pressure is either initiated or terminated at the same time. The application of heat and pressure at initiation and at termination may be in any order or simultaneous.

While the invention has been described with reference to a specific embodiment, it is obvious that there may be variations which properly fall within the scope of the invention. Therefore, the invention should be limited in scope only as may be necessitated by the scope of the appended claims.

What I claim as new and desire to secure by letters patent of the United States is:

1. The method of producing soft hexagonal boron nitride crystals of larger than 50 microns average particle size which comprise the steps of:
   a. mixing graphitic boron nitride particles (GBN) of less than 50 microns average particle size and lithium nitride, the boron nitride comprising 50 to 85 mole percent of the boron nitride-lithium nitride mixture,
   b. simultaneously subjecting said mixture, and (d) separating the GBN crystals from the mixture to values of pressure and temperature within Region FBCE of the Figure;
   c. cooling and depressurizing said mixture.

2. The method of claim 1 wherein separation of said GBN is accomplished by an aquaeous solution and separation of water-soluble material.

3. The method of claim 1 wherein the recovered GBN crystals have an average particle size of at least 100 microns.

4. The method of claim 1 wherein said mixture is pressurized to a maximum pressure of about atmospheric pressure in step (b).

5. The method of claim 1 wherein said mixture is subjected to said temperature and pressure of step (b) for a period of from twenty (20) minutes to four (4) hours.

6. The method of claim 6 wherein said GBN comprises about 43 weight percent of said mixture and the lithium nitride about 57 weight percent of said mixture.

7. The method of claim 1 wherein said mixture is subjected to said temperature and pressure of step (b) for a period in excess of twenty (20) minutes.

* * * * *